US008236412B2

(12) United States Patent
Jousset et al.

(10) Patent No.: US 8,236,412 B2
(45) Date of Patent: Aug. 7, 2012

(54) POLYAMIDE GRAFT POLYMER COMPOSITION AND USE THEREOF IN PHOTOVOLTAIC MODULES

(75) Inventors: Dominique Jousset, Serquigny (FR); Stephane Bizet, Serquigny (FR); Laurent B. Cartier, Wayne, PA (US)

(73) Assignee: Arkema France, Colombes (FR)

( * ) Notice: Subject to any disclaimer, the term of this patent is extended or adjusted under 35 U.S.C. 154(b) by 0 days.

(21) Appl. No.: 12/990,030

(22) PCT Filed: Apr. 27, 2009

(86) PCT No.: PCT/FR2009/050769
§ 371 (c)(1),
(2), (4) Date: Dec. 17, 2010

(87) PCT Pub. No.: WO2009/138679
PCT Pub. Date: Nov. 19, 2009

(65) Prior Publication Data
US 2011/0091707 A1    Apr. 21, 2011

Related U.S. Application Data

(60) Provisional application No. 61/053,781, filed on May 16, 2008.

(30) Foreign Application Priority Data

Apr. 28, 2008   (FR) ..................................... 08 52849

(51) Int. Cl.
*C08L 77/00* (2006.01)
*C08G 61/00* (2006.01)
*B29C 45/00* (2006.01)
*B29C 51/36* (2006.01)

(52) U.S. Cl. ..... 428/220; 428/435; 428/458; 428/474.4; 525/66; 525/183

(58) Field of Classification Search .................. 428/220, 428/435, 458, 474.4; 525/66, 183
See application file for complete search history.

(56) References Cited

U.S. PATENT DOCUMENTS

| | | | |
|---|---|---|---|
| 3,963,799 A | 6/1976 | Starkweather, Jr. | |
| 3,972,961 A | 8/1976 | Hammer et al. | |
| 3,976,720 A | 8/1976 | Hammer et al. | |
| 4,017,557 A | 4/1977 | Hammer et al. | |
| 4,217,430 A * | 8/1980 | Starkweather et al. | 525/183 |
| 5,342,886 A | 8/1994 | Glotin et al. | |
| 5,478,402 A | 12/1995 | Hanoka | |
| 6,414,236 B1 | 7/2002 | Kataoka et al. | |
| 6,846,874 B2 | 1/2005 | Baumert et al. | |
| 2002/0099134 A1 | 7/2002 | Bertin et al. | |
| 2003/0199635 A1 | 10/2003 | Court et al. | |
| 2004/0024127 A1 | 2/2004 | Baumert et al. | |
| 2004/0144415 A1 | 7/2004 | Arhart | |
| 2008/0220271 A1 | 9/2008 | Baumert et al. | |
| 2009/0035503 A1 | 2/2009 | Bertoux et al. | |

FOREIGN PATENT DOCUMENTS

| | | |
|---|---|---|
| FR | 2 878 265 | 5/2006 |
| JP | 03-086732 * | 4/1991 |
| WO | WO 2004/091901 | 10/2004 |
| WO | WO 2008/043958 | 4/2008 |

* cited by examiner

*Primary Examiner* — Ana Woodward
(74) *Attorney, Agent, or Firm* — Buchanan Ingersoll & Rooney

(57) ABSTRACT

The present invention relates to a thermoplastic composition including a polyamide graft polymer including a polyolefin backbone containing a residue of at least one unsaturated monomer having reacted with at least one polyamide graft. The invention also relates to structures, particularly multilayer structures, including said composition. One of the preferred structures of the present invention is a photovoltaic module including said composition. The composition according to the invention can advantageously be used as a binder or encapsulant. It is also used in solar panels and laminated glass.

14 Claims, 1 Drawing Sheet

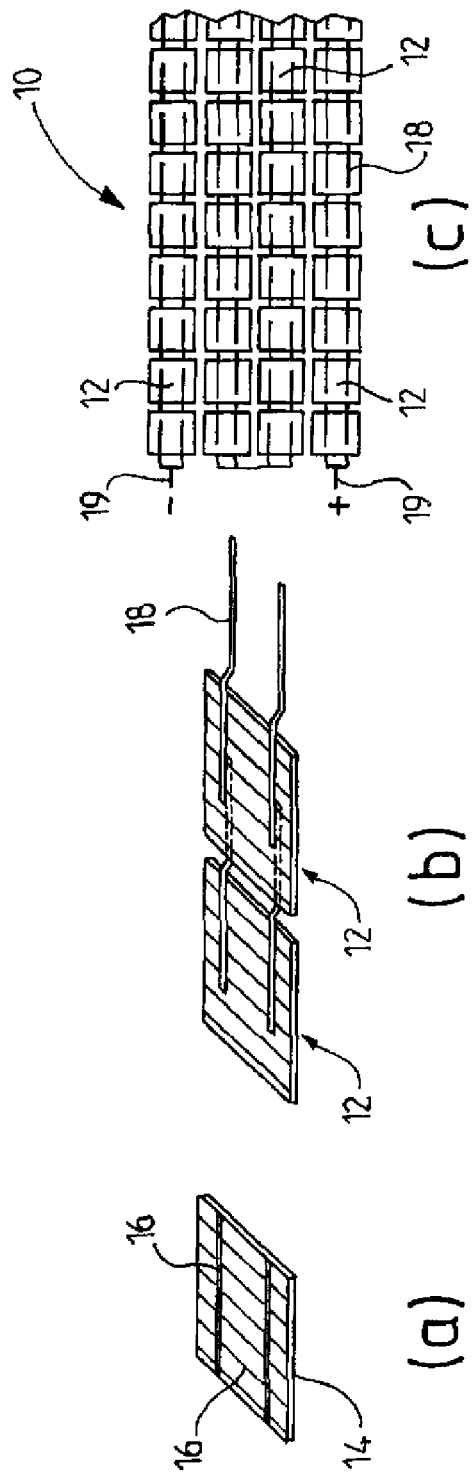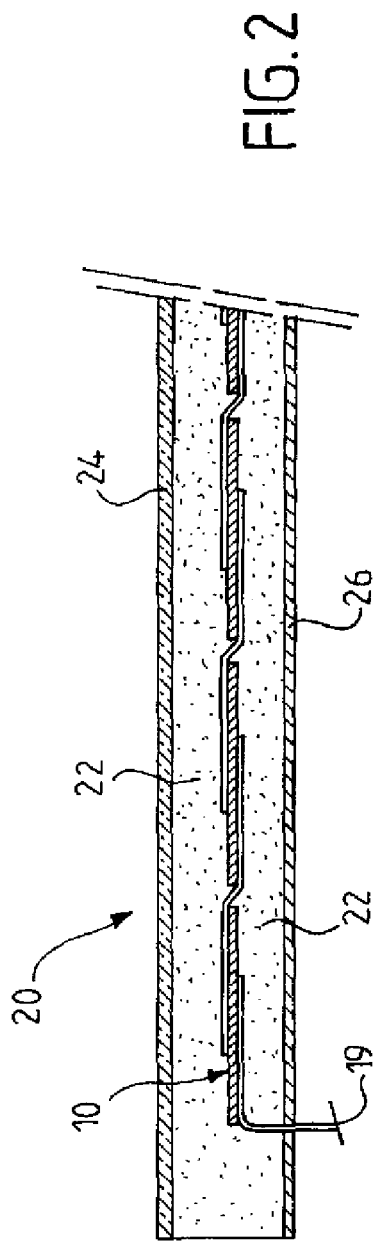

POLYAMIDE GRAFT POLYMER COMPOSITION AND USE THEREOF IN PHOTOVOLTAIC MODULES

FIELD OF THE INVENTION

One subject of the invention is a thermoplastic composition based on a polyamide-grafted polyolefin, a structure containing it, especially a solar module or laminated window structure, and also the use of this composition in solar modules.

Global warming, linked to the greenhouse gases released by fossil fuels, has led to the development of alternative energy solutions which do not emit such gases during their operation, such as, for example, solar modules. A solar module comprises a "photovoltaic cell", this cell being capable of converting light energy into electricity. In FIG. 1, a conventional photovoltaic cell is represented; this photovoltaic cell (10) comprises cells (12), one cell containing a photovoltaic sensor (14), generally based on silicon treated in order to obtain photoelectric properties, in contact with electron collectors (16) placed above (upper collectors) and below (lower collectors) the photovoltaic sensor. The upper collectors (16) of a cell are connected to the lower collectors (16) of another cell (12) by conducting bars (18), generally made from an alloy of metals. All these cells (12) are connected together, in series and/or in parallel, to form the photovoltaic cell (10). When the photovoltaic cell (10) is placed under a light source, it delivers a continuous electric current, which may be recovered at the terminals (19) of the cell (10).

With reference to FIG. 2, the solar module (20) comprises the photovoltaic cell (10) from FIG. 1 encased in an "encapsulant" (22). An upper protective layer (24) and a lower protective layer (26), also known under the name "backsheet", are positioned on both sides of the encapsulated cell.

The encapsulant (22) must perfectly take up the shape of the space existing between the photovoltaic cell (10) and the protective layers (24) and (26) in order to avoid the presence of air, which would limit the output of the solar module. The encapsulant (22) must also prevent the contact of the cells (12) with water and oxygen from the air, in order to limit the corrosion thereof.

The impact and moisture protection of the photovoltaic cell (10) is provided by the upper protective layer (24), generally made of glass.

The backsheet (26), for example a multilayer film based on a fluoropolymer and polyethylene terephthalate, contributes to the moisture protection of the solar module (20) and to the electrical insulation of the cells (12) to prevent any contact with the outside environment.

PRIOR ART

The various layers (photovoltaic cell, upper protective layer, encapsulant, backsheet) must adhere at their various interfaces to ensure a good output of the solar module and to prevent gases or water from infiltrating and causing premature ageing of this module.

One possible solution is to use an adhesive or tie layer between the various layers. Mention may be made, for example, of Application WO 2004/091901, which describes a backsheet structure for solar modules, in which a polyester-based or polyurethane-based adhesive is included between a layer of an ethylene/vinyl acetate copolymer (EVA) and a layer of a barrier polymer, in order to enable the adhesion of these two layers.

Another solution is to use an encapsulant, some examples of which will be described in the remainder of the prior art of the present description, this encapsulant having to have an adhesion with the upper protective layer, the backsheet and the photovoltaic cell.

In the presence of solar radiation, a temperature rise occurs inside the solar module and temperatures of 70° C. (or more) may be attained. The thermomechanical properties, and in particular the creep resistance, of the adhesive, of the tie or of the encapsulant must therefore be maintained at these temperatures so that the module is not deformed. The creep resistance is more particularly important in the case of the encapsulant: this is because, in case of creep, the cell may come into contact with the air and/or the upper and/or lower protective layers, which leads to a reduction in the output of the solar module, or even a degradation of the cell and of the solar module.

Furthermore, in order not to reduce the output of the solar module, it is necessary that the encapsulant allow the transmission of light waves from the solar radiation towards the cells. Again in order not to reduce the output, it is desirable that these waves be defracted very little, that is to say that the encapsulant must be, to the naked eye, transparent or slightly translucent, the transparency being quantified by its "degree of haze", which must be low. It is also necessary that the encapsulant has good electrical insulation properties, in order to avoid any short-circuiting inside the module.

The use, in solar modules, of an encapsulant based on an ethylene/vinyl acetate copolymer (EVA), described, for example, in Application JP 1987/0174967, currently forms the most widespread solution. EVA has good transparency. However, its adhesion with the protective layers is not satisfactory and adhesion-promoting agents, commonly known as "coupling agents" must therefore be added. These agents are products generally chosen from organic titanates or silanes. Furthermore, EVA degrades under the influence of solar radiation and temperature; thus, a release of acetic acid is observed which corrodes the photovoltaic cells. Furthermore, ageing of the encapsulant is also observed over time, which is especially manifested by significant yellowing, leading to a reduction in the output of the solar module.

Moreover, the creep resistance of EVA is not sufficient under the usage conditions of the solar modules. It is therefore necessary for this copolymer to be crosslinked; it is therefore no longer thermoplastic. The modules are then more difficult to recycle after this crosslinking step of the encapsulant. Furthermore, this crosslinking step forms an additional step in the process for manufacturing solar modules, which therefore leads to a loss of productivity.

During the manufacture of the solar modules, the various protective and encapsulant layers may be assembled by laminating. In this process, the assembly of the various layers that form the solar module is usually carried out by vacuum drawing. This vacuum drawing is carried out via a silicone membrane which is flattened against the solar module. When it is put under vacuum, the coupling agents, which are volatile, are sucked up and are deposited on the membrane. However, the silicone degrades in contact with the coupling agents; it is therefore necessary to do without them or limit their use therein in order to allow the use of this silicone membrane over a longer duration for the manufacture, in series, of several solar modules.

Moreover, in the field of laminated glass, layers of glass or/and of PMMA are used that are combined with ties based on EVA or on polyvinyl butyral (PVB); for the same reasons of creep resistance and adhesion, these ties must be crosslinked and contain coupling agents. The same problems of recyclability, productivity and ageing are encountered as for the solar modules.

For the laminated glass, the same type of manufacturing process is used and in particular the same temperatures as those used for the manufacture of solar modules.

In order to avoid a crosslinking step and to solve the problems of thermomechanical properties of the encapsulant, especially of creep resistance, the use has been envisaged, in the application published under the number WO 95/22843, of an ionomer as an encapsulant in the solar modules. This ionomer is a non-crosslinked thermoplastic copolymer of ethylene and of (meth)-acrylic acid partially neutralized by cations of elements from Groups I, II or III of the Periodic Table (for example zinc or calcium cations). The adhesion of this encapsulant with the photovoltaic cell and the protective layers is reasonable. These ionomers also have, to the naked eye, a good transparency. However, although the thermomechanical properties are better than those of non-crosslinked EVA, the creep resistance is not sufficient. This is because the formation of an ionic network allows the ionomer to retain a certain cohesion beyond its melting point, but without its creep resistance being completely satisfactory. Another major problem of the ionomer is its high viscosity at the customary temperatures for manufacturing solar modules (generally in the range from 120° C. to 160° C.). This high viscosity is a restraint on the productivity: this is because, in a continuous film manufacturing process, for example an extrusion manufacturing process, the film output on exiting the extruder decreases when the viscosity increases.

In U.S. Pat. No. 6,414,236, the encapsulant is an ethylene/alkyl acrylate/maleic anhydride terpolymer. This encapsulant is intended to improve the ageing resistance of the solar module. However, its creep resistance remains mediocre and it is therefore necessary to crosslink it: the encapsulant is therefore no longer thermoplastic.

It is therefore necessary to find a composition which can be used as a tie or as an encapsulant, in particular in solar modules, said composition being thermoplastic and not necessarily requiring crosslinking. It must also be able to have, during its manufacture, a low viscosity in order to be able to allow an optimal productivity.

All or some of the drawbacks and problems presented above apply not only to any type of solar module or laminated glass but also to any type of photovoltaic cell and integrated circuit that use silicon as a semiconductor.

SUMMARY OF THE INVENTION

Thus, one subject of the invention is a thermoplastic composition comprising a polyamide-grafted polymer, said polyamide-grafted polymer comprising a polyolefin backbone, the polyolefin backbone containing a residue of at least one unsaturated monomer (X) that has reacted with at least one polyamide graft. The graft is attached to the polyolefin backbone by the residue of the unsaturated monomer (X), said residue comprising a functional group capable of reacting via a condensation reaction with a polyamide that has at least one amine end group and/or at least one carboxylic acid end group. The unsaturated monomer (X) is attached to the polyolefin backbone by grafting or by copolymerization. The polyamide-grafted polymer comprises:
  from 50 to 95% by weight of the polyolefin backbone; and
  from 5 to 50% by weight of polyamide grafts, the backbone and the grafts being chosen so that said polyamide-grafted polymer has a flow temperature greater than or equal to 75° C., this flow temperature being defined as the highest temperature among the melting points and glass transition temperatures of the polyamide grafts and of the polyolefin backbone.

Surprisingly, the composition according to the invention combines sufficient properties of electrical insulation, water and oxygen barrier properties, tack and creep resistance at usage temperatures of around 70° C. or higher, even without a crosslinking step, these properties allowing its advantageous use in solar modules. Another advantage of the composition is its low viscosity in comparison with ionomers, which facilitates its implementation and the productivity of structures according to the invention.

A person skilled in the art could easily choose the polyamide-grafted polymer having the flow temperature suitable for the maximum usage temperature desired, namely above this temperature.

Described in Application US 2004/0144415 is a backsheet comprising an ionomer dispersed in a polyamide phase, this phase being continuous or co-continuous unlike the invention. The film is not used as an encapsulant. Furthermore, it is a simple blend and the polyamide is not grafted to the ionomer. This backsheet is not transparent. No adhesion property of this film has been described.

Described in Application EP 1 342 764 is a blend of a polyamide-grafted polymer with a tackifying resin (at least 20% by weight of the total of the composition). This document concerns the application of hot-melt adhesives which is a field very far removed from ties, encapsulants and solar panels.

Advantageously, the composition contains less than 20% by weight, preferably from 0 to 10%, for example from 0 to 5%, by weight of tackifying resin relative to the total weight of the composition. The absence of tackifying resin or its low content makes it possible to give the composition a transparency and/or a haze to visible light and/or a creep resistance suitable for use in a solar module and/or a laminated window. Surprisingly, even when the composition does not comprise tackifying resin, the tack of the composition is sufficient to be able to be used as a binder or an encapsulant.

Although the composition according to the invention has sufficient tack without coupling agents being added, it may advantageously comprise some.

The tack of the composition is further increased compared to a composition according to the invention that does not comprise any, while retaining, without crosslinking, the properties satisfactory for use in solar modules or a laminated window. For an equivalent adhesion, the amount of coupling agents necessary is lower in comparison with formulations based on EVA.

Advantageously, the composition comprises up to 20%, for example from 0.01 to 10% by weight and preferably from 0.1 to 5%, of the total weight of the composition.

Advantageously, the flow temperature of the polyamide-grafted polymer is the melting point or the glass transition temperature of the polyamide grafts.

According to a first embodiment of the invention, the flow temperature of the polyamide-grafted polymer is in the range from 115 to 160° C.

In this preferred flow temperature range, the composition has an exceptional creep resistance at the usage temperatures of solar modules. When it is used for manufacturing structures such as solar modules or a laminated window, the temperature ranges for manufacture of these structures are identical to those commonly used.

According to a second embodiment, the flow temperature of the polyamide-grafted polymer is in the range from 75 to 115° C., and advantageously from 85 to 115° C.

In this embodiment, the viscosity and/or the temperature for implementation of the polyamide-grafted polymer is particularly low, which makes it possible to improve the productivity and/or the manufacturing costs of the composition according to the invention and of structures produced from the latter. Although the creep resistance of the composition is slightly lower than that observed for the first embodiment, this composition retains a very good resistance at the usage temperatures in the solar modules.

Preferably, the composition of the invention transmits visible light and/or is transparent to visible light. According to the invention, the composition transmits visible light when it has a transmission greater than or equal to 80%; the composition is transparent to visible light when it has a degree of haze less than or equal to 10%. The transmission and the degree of haze of the composition are evaluated according to the ASTM D1003 standard, on a film of said composition having a thickness of 500 µm and for at least one wavelength in the visible range (from 380 to 780 nm). This composition is advantageously used as an encapsulant in solar modules or as a tie for manufacturing a laminated window.

Preferably, the composition of the invention is nanostructured. According to the invention, the expression "nanostructured composition" is understood to mean a composition comprising at least two immiscible phases and of which at least one of these phases has one of its dimensions (or more than one) below 780 nm. Advantageously, this dimension is below 380 nm, for example in the range from 60 to 380 nm and better still from 60 to 300 nm. The dimensions of the phases may be easily measured by a person skilled in the art using the technique known as transmission electron microscopy and standard image treatment software. Advantageously, with a view to obtaining good nanostructuring of the polyamide-grafted polymer, use is made, as the molecular weight of the polyamide grafts, of a number-average molecular weight in the range from 1000 to 5000 g/mol, preferably in the range from 2000 to 3000 g/mol.

Surprisingly, when the composition is nanostructured, a composition is obtained that transmits visible light and/or is transparent to visible light according to the definition of the invention, is adhesive and has a very good creep resistance at temperatures which may reach 70° C., or even more. Combined with its water barrier properties, gas barrier properties and its electrical properties, this thermoplastic composition may very advantageously be used as an encapsulant in the field of solar modules, without it being necessary to carry out a crosslinking of the composition.

It is preferred that the polyamide grafts comprise at least one copolyamide graft. The composition according to the invention then transmits visible light more extensively and/or is more transparent to visible light than for a polyamide-grafted polymer for which the grafts are made from a homopolyamide.

Advantageously, the melting point of the polyolefin backbone is below 100° C. The composition according to the invention then transmits light more extensively and/or is more transparent than for a polyolefin backbone having a melting point above 100° C. According to one particular embodiment, the polyolefin backbone does not have a melting point, which further increases the transparency.

Preferably, the polyolefin backbone comprises, on average, a number of monomer residues (X) greater than or equal to 1.3 and/or preferably less than or equal to 10. The dimensions of the nanostructured phase or phases of the composition decrease when these conditions are met, which further improves the transparency and creep resistance properties.

The unsaturated monomer (X) included in or on the polyolefin backbone is preferably maleic anhydride.

The yield of the condensation reaction of the polyamide grafts on the polyolefin backbone is thus improved relative to polyolefin backbones that do not comprise any.

Advantageously, the polyolefin backbone is a copolymer. The composition according to the invention is then more flexible than when the polyolefin backbone is a homopolymer; it is better suited for its use as an encapsulant, for example in solar modules.

Advantageously, the polyolefin backbone comprising the residue of (X) of the polyamide-grafted polymer is an ethylene/alkyl (meth)acrylate copolymer.

The composition then has a better ageing behaviour under the effect of visible light and temperature than EVA.

The end groups of the polyamide graft advantageously comprise at least one amine functional group.

The yield of the condensation reaction of the polyamide grafts on the polyolefin backbone is then improved.

The composition may also comprise another polymer, known as a complementary polymer, which is different from a tackifying resin. Preferably, this complementary polymer is miscible or partially miscible with the polyamide-grafted polymer. This complementary polymer may represent less than 55% of the total weight of the composition and preferably less than 20% of the composition.

It is then possible to decrease the cost of the composition. In the case where this complementary polymer is miscible or partially miscible, the composition then has an excellent compromise of cost/transmission of visible light and/or transparency to visible light.

Preferably, the composition comprises less than 10% by weight of elastomer and, for example, from 0 to 5% by weight.

Preferably, the composition comprises at least 75% by weight of the polyamide-grafted polymer.

It then has a better creep resistance than that which comprises less than 75% of the polyamide-grafted polymer; the composition also has a better transparency and/or allows visible light to pass through more easily.

The composition may in addition, comprise at least one of the additional components chosen from crosslinking agents, UV absorbers, mineral fillers, plasticizers, flame retardants, and colouring or brightening compounds.

During the use of the composition as a tie in a laminated window or as an encapsulant in a solar module, the nature and/or the concentration of these components should be such that the final composition remains transparent and/or transmits visible light. By way of example, these compounds may represent from 0 to 20%, for example from 0.01 to 10%, of the total weight of the composition.

According to one particular embodiment of the invention, the composition contains, relative to the total weight of the composition:
i) from 41 to 100% by weight of polyamide-grafted polymer;
ii) from 0 to 20% by weight of non-polymeric coupling agent;
iii) from 0 to 20% by weight of additional components; and
iv) from 0 to 19% by weight of a polymer other than a tackifying resin.

The invention also relates to a structure comprising the composition, this structure preferably having a thickness between 5 µm and 2 mm.

This structure may be a multilayer structure and may comprise at least one support onto which the thermoplastic composition according to the invention is applied. In the case of use of the structure as a solar module, the support may constitute the upper or lower protective layer or else the photovoltaic cell. This support may be made from glass, from a polymer and in particular from PMMA, from metal or from any type of photovoltaic sensor.

Another subject of the invention is a solar module or a laminated window, in particular made of laminated glass, which are particular structures according to the invention. In the case of a laminated window, the composition may act as a tie between two layers of a laminated window.

The composition according to the invention may advantageously be used as a tie and/or as an encapsulant. It may also advantageously be used in solar modules or in laminated windows.

DESCRIPTION OF THE APPENDED FIGURES

The description which follows is given solely by way of illustration and non-limitingly with reference to the appended figures, in which:

FIG. 1, already described, represents an example of a photovoltaic cell, the parts (a) and (b) being ¾ views, the part (a) showing a cell before connection and the part (b) a view after connection of 2 cells; the part (c) is a top view of a complete photovoltaic cell.

FIG. 2, already described, represents a cross section of a solar module.

DETAILED DESCRIPTION OF THE INVENTION

Regarding the polyolefin backbone, this is a polymer comprising an α-olefin as a monomer.

The α-olefins having from 2 to 30 carbon atoms are preferred.

As an α-olefin, mention may be made of ethylene, propylene, 1-butene, 1-pentene, 3-methyl-1-butene, 1-hexene, 4-methyl-1-pentene, 3-methyl-1-pentene, 1-octene, 1-decene, 1-dodecene, 1-tetradecene, 1-hexadecene, 1-octadecene, 1-eicosene, 1-docosene, 1-tetracosene, hexacosene, 1-octacosene, and 1-triacontene. Within the context of the present invention, the term "α-olefin" also includes styrene. Propylene, and most especially ethylene, are preferred as the α-olefin.

This polyolefin may be a homopolymer when a single α-olefin is polymerized in the polymer chain. Mention may be made, as examples, of polyethylene (PE) or polypropylene (PP).

This polyolefin may also be a copolymer when at least two comonomers are copolymerized in the polymer chain, one of the two comonomers known as the "first comonomer" being an α-olefin and the other comonomer, known as the "second comonomer", is a monomer capable of polymerizing with the first monomer.

As the second comonomer, mention may be made of:
one of the α-olefins already cited, this being different from the first α-olefin comonomer;
dienes such as, for example, 1,4-hexadiene, ethylidene, norbornene and butadiene;
unsaturated carboxylic acid esters such as, for example, the alkyl acrylates or alkyl methacrylates grouped together under the term alkyl (meth)acrylates. The alkyl chains of these (meth)acrylates may have up to 30 carbon atoms. Mention may be made, as alkyl chains, of methyl, ethyl, propyl, n-butyl, sec-butyl, isobutyl, tert-butyl, pentyl, hexyl, heptyl, octyl, 2-ethylhexyl, nonyl, decyl, undecyl, dodecyl, tridecyl, tetradecyl, pentadecyl, hexadecyl, heptadecyl, octadecyl, nonadecyl, eicosyl, hencosyl, docosyl, tricosyl, tetracosyl, pentacosyl, hexacosyl, heptacosyl, octacosyl, nonacosyl. Methyl, ethyl and butyl (meth)acrylates are preferred as unsaturated carboxylic acid esters; and
vinyl esters of carboxylic acids. As examples of vinyl esters of carboxylic acids, mention may be made of vinyl acetate, vinyl versatate, vinyl propionate, vinyl butyrate or vinyl maleate. Vinyl acetate is preferred as the vinyl ester of a carboxylic acid.

Advantageously, the polyolefin backbone comprises at least 50 mol % of the first comonomer; its density may advantageously be between 0.91 and 0.96.

The preferred polyolefin backbones are formed from an ethylene/alkyl (meth)acrylate copolymer. By using this polyolefin backbone, an excellent resistance to ageing due to light and to temperature is obtained.

It would not be outside the scope of the invention if various "second comonomers" were copolymerized in the polyolefin backbone.

According to the present invention, the polyolefin backbone contains at least one residue of an unsaturated monomer (X) which may react with an acid and/or amine functional group of the polyamide graft via a condensation reaction. According to the definition of the invention, the unsaturated monomer (X) is not a "second comonomer".

As the unsaturated monomer (X) included in the polyolefin backbone, mention may be made of:
unsaturated epoxides. Among these, there are, for example, aliphatic glycidyl esters and ethers such as allyl glycidyl ether, vinyl glycidyl ether, glycidyl maleate and glycidyl itaconate, glycidyl acrylate and glycidyl methacrylate. They are also, for example, alicyclic glycidyl esters and ethers such as 2-cyclohexene-1-glycidyl ether, cyclohexene-4,5-diglycidylcarboxylate, cyclohexene-4-glycidylcarboxylate, 5-norbornene-2-methyl-2-glycidylcarboxylate and endocis-bicyclo-[2.2.1]-5-heptene-2,3-diglycidyldicarboxylate. It is preferred to use glycidyl methacrylate as the unsaturated epoxide;
unsaturated carboxylic acids and salts thereof, for example acrylic acid or methacrylic acid and the salts of these same acids; and
carboxylic acid anhydrides. They may be chosen, for example, from maleic, itaconic, citraconic, allylsuccinic, cyclohex-4-ene-1,2-dicarboxylic, 4-methylenecyclohex-4-ene-1,2-dicarboxylic, bicyclo[2.2.1] hept-5-ene-2,3-dicarboxylic and x-methylbicyclo [2.2.1]hept-'5-ene-2,2-dicarboxylic anhydrides. It is preferred to use maleic anhydride as the carboxylic acid anhydride.

The unsaturated monomer (X) is preferably chosen from an unsaturated carboxylic acid anhydride and an unsaturated epoxide. In particular, to carry out the condensation of the polyamide graft with the polyolefin backbone, in the case where the reactive end group of the polyamide graft is a carboxylic acid functional group, the unsaturated monomer (X) is preferably an unsaturated epoxide. In the case where the reactive end group of the polyamide graft is an amine functional group, the unsaturated monomer (X) is advantageously an unsaturated epoxide and preferably an unsaturated carboxylic acid anhydride.

According to one advantageous version of the invention, the preferred number of unsaturated monomers (X) attached, on average, to the polyolefin backbone is greater than or equal to 1.3 and/or preferably less than or equal to 10.

Thus, when (X) is maleic anhydride and the number-average molecular weight of the polyolefin is 15 000 g/mol, it is found that this corresponds to an anhydride proportion of at least 0.8% and at most 6.5% by weight of the polyolefin backbone assembly. These values, combined with the weight of polyamide grafts, determine the proportion of polyamide and of backbone in the polyamide-grafted polymer.

The polyolefin backbone containing the residue of the unsaturated monomer (X) is obtained by polymerization of the monomers (first comonomer, optional second comonomer, and optionally unsaturated monomer (X)). This polymerization may be carried out by a high-pressure free-radical process or a process in solution, in an autoclave or tubular reactor, these processes and reactors being well known to a person skilled in the art. When the unsaturated monomer (X) is not copolymerized in the polyolefin backbone, it is grafted to the polyolefin backbone. The grafting is also an operation that is known per se. The composition would be in accordance with the invention if several different functional monomers (X) were copolymerized with and/or grafted to the polyolefin backbone.

Depending on the types and ratio of monomers, the polyolefin backbone may be semicrystalline or amorphous. In the case of amorphous polyolefins, only the glass transition temperature is observed, whereas in the case of semicrystalline polyolefins, a glass transition temperature and a melting point (which will inevitably be higher) are observed. A person skilled in the art will only have to select the monomer ratios and the molecular weights of the polyolefin backbone in order to be able to easily obtain the desired values of the glass transition temperature, optionally of the melting point and also of the viscosity of the polyolefin backbone.

Preferably, the polyolefin has a melt flow index (MFI) between 3 and 400 g/10 min (190° C./2.16 kg, ASTM D 1238).

The polyamide grafts may be either homopolyamides or copolyamides.

The expression "polyamide grafts" especially targets the aliphatic homopolyamides which result from the polycondensation:
  of a lactam;
  or of an aliphatic α,ω-aminocarboxylic acid;
  or of an aliphatic diamine and an aliphatic diacid.

As examples of a lactam, mention may be made of caprolactam, oenantholactam and lauryllactam.

As examples of an aliphatic α,ω-aminocarboxylic acid, mention may be made of aminocaproic acid, 7-aminoheptanoic acid, 11-aminoundecanoic acid and 12-aminododecanoic acid.

As examples of an aliphatic diamine, mention may be made of hexamethylenediamine, dodecamethylenediamine and trimethylhexamethylenediamine.

As examples of an aliphatic diacid, mention may be made of adipic, azelaic, suberic, sebacic and dodecane-dicarboxylic acids.

Among the aliphatic homopolyamides, mention may be made, by way of example and non-limitingly, of the following polyamides: polycaprolactam (PA-6); polyundecanamide (PA-11, sold by Arkema under the brand RILSAN®); polylauryllactam (PA-12, also sold by Arkema under the brand RILSAN®); polybutylene adipamide (PA-4,6); polyhexamethylene adipamide (PA-6,6); polyhexamethylene azelamide (PA-6,9); polyhexamethylene sebacamide (PA-6,10); polyhexamethylene dodecanamide (PA-6,12); polydecamethylene dodecanamide (PA-10,12); polydecamethylene sebacamide (PA-10,10) and poly-dodecamethylene dodecanamide (PA-12,12).

The expression "semicrystalline polyamides" also targets cycloaliphatic homopolyamides.

Mention may especially be made of the cycloaliphatic homopolyamides which result from the condensation of a cycloaliphatic diamine and an aliphatic diacid.

As an example of a cycloaliphatic diamine, mention may be made of 4,4'-methylenebis(cyclohexylamine), also known as para-bis(aminocyclohexyl)methane or PACM, 2,2'-dimethyl-4,4'-methylenebis(cyclohexylamine), also known as bis(3-methyl-4-aminocyclohexyl)methane or BMACM.

Thus, among the cycloaliphatic homopolyamides, mention may be made of the polyamides PA-PACM,12 that results from the condensation of PACM with the C12 diacid, PR-BMACM,10 and PA-BMACM,12 that result from the condensation of BMACM with, respectively, C10 and C12 aliphatic diacids.

The expression "polyimide grafts" also targets the semiaromatic homopolyamides that result from the condensation:
  of an aliphatic diamine and an aromatic diacid, such as terephthalic acid (T) and isophthalic acid (I). The polyamides obtained are then commonly known as "polyphthalamides" or PPAs; and
  of an aromatic diamine, such as xylylene-diamine, and more particularly meta-xylylene-diamine (MXD) and an aliphatic diacid.

Thus, non-limitingly, mention may be made of the polyamides PA-6,T, PA-6,I, PA-MXD,6 or else PA-MXD,10.

The polyamide grafts coming into play in the composition according to the invention are preferably copolyamides. These result from the polycondensation of at least two of the groups of monomers mentioned above used for obtaining homopolyamides. The term "monomer" in the present description of the copolyamides should be taken in the sense of a "repeat unit". This is because the case where a repeat unit of the PA is drawn from the combination of a diacid with a diamine is particular. It is considered that it is the combination of a diamine and a diacid, that is to say the diamine.diacid pair (in an equimolar amount), which corresponds to the monomer. This is explained by the fact that individually, the diacid or the diamine is only one structural unit, which is not enough on its own to polymerize in order to give a polyamide.

Thus, the copolyamides especially cover the condensation products of:
  at least two lactams;
  at least two aliphatic α,ω-aminocarboxylic acids;
  at least one lactam and at least one aliphatic α,ω-aminocarboxylic acid;
  at least two diamines and at least two diacids;
  at least one lactam with at least one diamine and at least one diacid;
  at least one aliphatic α,ω-aminocarboxylic acid with at least one diamine and at least one diacid,
the diamine(s) and the diacid(s) possibly being, independently of one another, aliphatic, cycloaliphatic or aromatic.

Depending on the types and ratio of monomers, the copolyamides may be semicrystalline or amorphous. In the case of amorphous copolyamides, only the glass transition temperature is observed, whereas in the case of semicrystalline copolyamides a glass transition temperature and a melting point (which will inevitably be higher) are observed.

Among the amorphous copolyamides that can be used within the context of the invention, mention may be made, for example, of the copolyamides containing semiaromatic monomers.

Among the copolyamides, it is also possible to use semicrystalline copolyamides and particularly those of the PA-6/11, PA-6/12 and PA-6/11/12 type.

The degree of polymerization may vary to a large extent; according to its value it is a polyamide or a polyamide oligomer.

Advantageously, the polyamide grafts are mono-functional.

So that the polyamide graft has a monoamine end group, it is sufficient to use a chain limiter of formula:

in which:
R$_1$ is hydrogen or a linear or branched alkyl group containing up to 20 carbon atoms; and
R$_2$ is a group having up to 20 carbon atoms that is a linear or branched alkyl or alkenyl group, a saturated or unsaturated cycloaliphatic radical, an aromatic radical or a combination of the preceding. The limiter may be, for example, laurylamine or oleylamine.

So that the polyamide graft has a carboxylic monoacid end group, it is sufficient to use a chain limiter of formula R'1-COOH, R'1-CO—O—CO—R'2 or a carboxylic diacid.

R'1 and R'2 are linear or branched alkyl groups containing up to 20 carbon atoms.

Advantageously, the polyamide graft has one end group having an amine functionality. The preferred monofunctional polymerization limiters are laurylamine and oleylamine.

Advantageously, the polyamide grafts have a molecular weight between 1000 and 5000 g/mol and preferably between 2000 and 3000 g/mol.

The polycondensation described above is carried out according to the commonly known processes, for example at a temperature generally between 200 and 300° C., under vacuum or in an inert atmosphere, with stirring of the reaction mixture. The average chain length of the graft is determined by the initial molar ratio between the polycondensable monomer or the lactam and the monofunctional polymerization limiter. For the calculation of the average chain length, one chain limiter molecule is usually counted per one graft chain.

A person skilled in the art will only have to select the types and ratio of monomers and also choose the molecular weights of the polyamide grafts in order to be able to easily obtain the desired values of the glass transition temperature, optionally of the melting point and also of the viscosity of the polyamide graft.

The condensation reaction of the polyamide graft on the polyolefin backbone containing the residue of (X) is carried out by reaction of one amine or acid functional group of the polyamide graft with the residue of (X). Advantageously, monoamine polyamide grafts are used and amide or imide bonds are created by reacting the amine functional group with the functional group of the residue of (X).

This condensation is preferably carried out in the melt state. To manufacture the composition according to the invention, it is possible to use conventional mixing and/or extrusion techniques. The components of the composition are thus blended to form a compound which may optionally be granulated on exiting the die. Advantageously, coupling agents are added during compounding.

To obtain a nanostructured composition, it is thus possible to blend the polyamide graft and the backbone in an extruder at a temperature generally between 200 and 300° C. The average residence time of the molten material in the extruder may be between 5 seconds and 5 minutes, and preferably between 20 seconds and 1 minute. The efficiency of this condensation reaction is evaluated by selective extraction of free polyamide grafts, that is to say those that have not reacted to form the polyamide-grafted polymer.

The preparation of polyamide grafts having an amine end group and also their addition to a polyolefin backbone containing the residue of (X) is described in U.S. Pat. Nos. 3,976,720, 3,963,799, 5,342,886 and FR2291225.

The polyamide-grafted polymer of the present invention advantageously has a nanostructured organization. To obtain this type of organization, use will preferably be made, for example, of grafts having a number-average molecular weight $M_n$ between 1000 and 5000 g/mol and more preferably between 2000 and 3000 g/mol. Use will also preferably be made of 15 to 30% by weight of polyamide grafts and a number of monomers (X) between 1.3 and 10.

Advantageously, the flow temperature of the polyamide-grafted polymer is less than or equal to 160° C., which allows a processing temperature that is particularly well suited to the current techniques for manufacturing solar panels.

Owing to the elements given in this description, a person skilled in the art will thus be able to adjust the various parameters choice of grafts, amounts, choice of polyolefin) in order to choose the final properties of flow temperature, of fluidity, of thermomechanical properties, of light transmission and of transparency.

The composition would also be in accordance with the invention if it comprised a blend of polyamide-grafted polymers such as defined previously.

It would not be outside the scope of the invention if at least one other polymer was added to the composition so as to reduce the cost of the composition. Preferably, use will be made of a polymer that is miscible or partially miscible with the polyamide-grafted polymer. A person skilled in the art will know how to choose the polymers that are miscible or partially miscible with the polyamide-grafted polymer. For example, it is possible to use a polyolefin or a polyamide of the same type as that used to manufacture the polyamide-grafted polymer. It will thus be possible to retain the nanostructuring in the case where the polyamide-grafted polymer is nanostructured. The composition advantageously comprises at least 25%, preferably at least 41% and more preferably still at least 75% by weight of polyamide-grafted polymer.

Advantageously, the flow temperature of the composition, defined as the highest temperature from among the flow temperature of the polyamide-grafted polymer and the melting points and glass transition temperatures of the other polymers of the composition, is below 160° C. Preferably, the highest temperature from among the flow temperature of the composition is equal to the flow temperature of the polyamide-grafted polymer.

In order to determine the flow temperatures of the polyamide-grafted polymer and of the composition, a person skilled in the art will easily be able to measure the melting points and glass transition temperatures of the polyolefin backbone, of the polyamide grafts and of the other polymers by differential scanning calorimetry, commonly known as DSC, using a heating rate of 10° C. per minute.

Among the list of additives below, a person skilled in the art will know how to easily select their amounts in order to obtain the desired properties of the composition.

Coupling agents may advantageously be added in order to improve the tack of the composition when this must be particularly high. According to the invention, the coupling agent is a non-polymeric ingredient; it may be organic, mineral and more preferably semi-mineral and semiorganic. Among these, mention may be made of organic silanes or titanates, such as for example monoalkyl titanates, trichlorosilanes and trialkoxysilanes.

Although crosslinking is not essential, it is possible to further improve the thermomechanical properties of the encapsulant, in particular when the temperature becomes very high. It is therefore not outside the scope of the invention if crosslinking agents are added. Mention may be made, as examples, of organic peroxides or isocyanates. This crosslinking may also be carried out by known irradiation techniques.

Preferably, the composition does not comprise more than 10% of tackifying resin and preferably does not comprise any. This is because, when these resins are added to the polyamide-grafted polymer, the transparency of the composition and the creep resistance decrease. These tackifying resins are, for example, rosins and derivatives thereof and polyterpenes and derivatives thereof. Surprisingly, no tackifying resin is necessary to give the composition properties of adhesion to various supports of solar modules.

Since UV radiation leads to yellowing of the encapsulant, UV stabilizers may be added in order to ensure the transparency of the encapsulant during its lifetime. These compounds may be, for example, based on benzophenone or benzotriazole. They can be added in amounts below 10%, and preferably from 0.1 to 5%, by weight of the total weight of the composition.

Fillers, in particular mineral fillers, may be added to improve the thermomechanical strength of the composition. Non-limitingly, silica, alumina or calcium carbonates or carbon nanotubes will be given as examples. Advantageously, modified or non-modified clays, which are mixed on a nanoscale, are used; this makes it possible to obtain a more transparent composition.

Plasticizers could be added in order to facilitate processing and improve the productivity of the manufacturing process of the composition and of the structures. Mention will be made, as examples, of paraffinic, aromatic or naphthalenic mineral oils which also make it possible to improve the tack of the composition according to the invention. Mention may also be made, as a plasticizer, of phthalates, azelates, adipates, and tricresyl phosphate.

Flame retardants could also be added.

It will also be possible to add colouring or brightening compounds.

Another subject of the invention are structures which comprise the composition according to the invention. Preferably, the structure has a thickness between 5 μm and 2 mm, preferably between 100 μm and 1 mm and more preferably still between 300 and 500 μm. These structures may, in particular, take the form of a film. These films will be able to advantageously be used for encapsulating solar cells. These structures may be single-layer structures or multilayer structures. For the latter, it is possible, for example, to combine a support with the layer of the composition according to the invention, this support possibly comprising polymers. As an example of polymers, mention may be made of polyolefins, such as for example EVA, these polyolefins possibly comprising an unsaturated monomer, ionomers, polyamides, fluoropolymers (such as polyvinyl fluoride PVF or polyvinylidene fluoride PVDF) or polymethyl methacrylate (PMMA). Mention may also be made, as another support, of those made from metals or any type of photovoltaic cell.

These structures may be obtained from the compound described previously by the conventional techniques of press moulding, injection moulding, tubular (bubble) extrusion-blow moulding, extrusion-lamination, extrusion-coating, extrusion-casting (also called film casting) or else sheet extrusion-calendering, all these structures possibly being optionally thermoformed afterwards. It would not be outside the scope of the invention if the structure or the film according to the invention were obtained directly without passing through the compound step.

Generally, to form a solar module, placed successively on a backsheet are a first lower layer of encapsulant, a photovoltaic cell, a second upper layer of encapsulant then an upper protective layer. Additional layers, in particular tie or adhesive layers, may moreover be found. These various layers are assembled to form the module. It is specified that the photovoltaic modules according to the invention may be formed from any photovoltaic structure comprising a layer of the composition according to the invention and are obviously not limited to those presented in this description.

Thus, the composition according to the invention may be used as a tie to these various supports or as an encapsulant to form solar modules. In one very advantageous version, the layers of encapsulant (and in particular the upper encapsulant layer) are transparent in accordance with the parameters given in the present description. One way of obtaining this transparency is to use a composition for which the polyamide grafts and the polyolefin are nanostructured.

In order to form the photovoltaic cell, it is possible to use any type of photovoltaic sensors including sensors known as "conventional sensors" based on monocrystalline or polycrystalline doped silicon; thin-film sensors formed, for example, from amorphous silicon, cadmium telluride, copper indium diselenide or organic materials may also be used.

As examples of a backsheet that can be used in the solar modules, mention may be made, non-exhaustively, of monolayer or multilayer films based on polyester, on a fluoropolymer (PVF or PVDF).

One can cite also as backsheet, films comprising polyolefins such as polyethylene or polypropylene, these polyolefins being or not modified. For examples of modified polyolefins, one can cite copolymers comprising ethylene with at least one functional monomer such as the unsaturated (meth)acrylic esters, the unsaturated carboxylic acids or the anhydride carboxylic acids such as maleic anhydride. These modified polyolefins can also be a blend of polyolefin with another polymer such as polyamide polyamide.

As a particular structure of a backsheet, one can cite for example multilayer fluoropolymer/polyethylene terephthalate/fluoropolymer or else fluoropolymer/poly-ethylene terephthalate/EVA films.

The backsheet layer can also be associated to the encapsulant layer through classical manufacture process of multilayer film. One can cite for example coextrusion of film through extrusion-blowing of a sheath, through extrusion-lamination, through extrusion-coating, through extrusion cast or also through calendering. The coextrusion of a layer of the composition according to the invention as encapsulant with a layer of polyolefin as backsheet.

The protective sheet has abrasion and impact resistance properties, is transparent and protects the photovoltaic sensors from external moisture. In order to form this layer, mention may be made of glass, PMMA or any other polymer composition that brings together these characteristics.

In order to assemble the various layers of the photovoltaic module, it is possible to use any type of press-moulding techniques such as, for example, hot pressing, vacuum pressing or lamination, in particular thermal lamination. The manufacturing conditions will be easily determined by a person skilled in the art by adjusting the temperature and the pressure to the flow temperature of the composition.

In order to manufacture the solar modules according to the invention, a person skilled in the art may refer, for example, to the *Handbook of Photovoltaic Science and Engineering*, Wiley, 2003.

It is also possible to manufacture a laminated window, in particular made of laminated glass, by using the composition according to the invention with the processing techniques and conditions presented for solar panels.

The present invention will now be illustrated by particular exemplary embodiments described below. It is specified that these examples in no way aim to limit the scope of the present invention.

EXAMPLES

In order to produce examples of the composition and of the structures according to the invention, the following products were used:

LOTADER® 7500: copolymer of ethylene, of ethyl acrylate (17.5 wt %) and of maleic anhydride (2.8 wt %) produced by Arkema having an MFI of 70 g/10 min (190° C./2.16 kg measured according to ASTM D 1238) and a $T_m$ equal to 85° C.

LOTADER® 8200: copolymer of ethylene, of ethyl acrylate (6.5 wt %) and of maleic anhydride (2.8 wt %) produced by Arkema having an MFI of 200 g/10 min (190° C./2.16 kg measured according to ASTM D 1238) and a $T_m$ equal to 100° C.

PA-6/12: copolyamide of caprolactam and of lauryllactam comprising 80 wt % of lauryllactam and 20 wt % of caprolactam. This copolyamide is primary amine monofunctionalized, has a number-average molecular weight of 2500 g/mol and has a $T_m$ equal to 145° C.

LACQTENE® 1020 FN 24: low-density PE sold by Total Petrochemicals whose MFI is 2.1 g/10 min (ASTM D 1238—190° C./2.16 kg).

The compositions according to the invention (EX1 and EX2) and the comparative composition (CP1) and also their weight ratios are given in Table 1:

TABLE 1

| Constituents | EX1 | EX2 | CP1 |
| --- | --- | --- | --- |
| LOTADER ® 7500 | 0.8 | — | — |
| LOTADER ® 8200 | — | 0.8 | 1 |
| PA-6/12 | 0.2 | 0.2 | — |

These compositions were extruded at 240° C., at 300 rpm with a screw having an L/D dimension equal to 44 in order to form a compound. The two compounds obtained were nanostructured.

In order to show the advantageous properties of the compositions according to the invention and their advantageous use in solar modules, the following comparative compositions were also used:
CP2: ionomer-based composition
CP3: composition based on an EVA copolymer comprising 33 wt % of vinyl acetate and having an MFI of 45 g/10 min (ASTM D 1238—190° C./2.16 kg) and an organic peroxide.

In order to evaluate the properties of the examples and comparative examples, films were produced by extrusion-casting having a thickness of 0.5 mm on a Randcastle-type laboratory extruder.

The film of the composition CP3 was subsequently crosslinked by a heat treatment at 150° C. for 20 min in a press.

The transparency of the films was evaluated by measuring the transmission of test specimens at 560 nm and also the degree of haze was evaluated according to the ASTM D1003 standard with an illuminant C at an angle of 2°.

The creep resistance at 120° C. was determined on IFC (French Institute of Rubber)-type test specimens cut from the films. The test consisted in applying a stress of 0.5 MPa for 15 min at a given temperature and in measuring the residual elongation after return to ambient temperature.

The rheological behaviour, at a 150° C. isotherm, of the compositions was determined using a Physica MCR 301 viscometer in plate/plate geometry. For all the samples, a temperature ramp of 5° C./min was applied from 90° C. to 150° C., then an isothermal hold at 150° C. for 30 min was carried out. During this temperature cycle, the viscoelastic and rheological properties were measured at an oscillation frequency of 1 Hz. The dynamic viscosities at 150° C. were recorded at the start of the isothermal hold (at t=0) and after 10 minutes when the viscosity became stable.

The electrical volume resistivity was determined at 23° C. using a Novocontrol Concept 40 dielectric spectrometer. For each temperature, a frequency sweep was carried out between 0.1 Hz and $10^6$ Hz. The low-frequency (0.1 Hz) resistivity of the samples was recorded when this resistivity was independent of the frequency.

The adhesion of EX1 to glass was also evaluated according to the following procedure: a two-layer film of LACQTENE® 1020 FN 24/EX1 was coextruded by extrusion-casting with respective thicknesses of 200 μm and 20 μm. This film was pressed, on the EX1 side, onto a glass sheet having dimensions of 200 (length)×50 (width)×3 (thickness) $mm^3$ at 150° C. under 3 bar of pressure for 20 min. The adhesion was evaluated from a 90° peel test carried out at 100 mm/min on a Zwick 1445 tensile testing machine, according to the ISO 8510-1 standard. The width of the peeling arms was 15 mm. During the tests, it was observed that there was no rupture of the adhesion between the PE and the tie: thus, only the peel strength between the glass support and the EX1 composition was measured.

The results obtained are given in Table 2.

The examples of the compositions according to the invention (EX1 and EX2) showed the compositions according to the invention had a creep resistance at 120° C. which was very significantly greater than that of the ionomers (CP2), which was also a thermoplastic material, the test not having allowed the measurement of the elongation since the ionomer crept too much (>300%). Another advantage was the lower viscosity during the processing of the compositions according to the invention. This made it possible to improve the productivity during the manufacture of the compound and of the films or structures using this composition.

Furthermore, the transparency of the compositions was close to that of the ionomers. If EX2 is compared with CP1, it is observed that the transparency is slightly improved, and that the degree of haze is much better with the composition according to the invention.

The resistivity was also similar to that observed for the comparative composition based on crosslinked EVA.

The compositions according to the invention therefore fulfil the criteria to be able to be used very advantageously as a tie or encapsulant in solar modules.

It is also possible to note that no coupling agent was necessary in order for the composition to have tack.

TABLE 2

| Examples | Transmission | Degree of haze | Creep resistance | Dynamic viscosity t = 0 (Pa·s) | Dynamic viscosity t = 10 min (Pa·s) | Electrical volume resistivity (Ω·cm) at 23° C. | Adhesion to glass (peel strength in N/15 mm) |
|---|---|---|---|---|---|---|---|
| EX1 | 90.6% | 3% | 10% | 990 | 980 | $5 \times 10^{13}$ | 11.2 |
| EX2 | 88.8% | 5% | 12.5% | 810 | 620 | $10^{14}$ | not measured |
| CP1 | 87.1% | 40% | not measured | not measured | not measured | not measured | not measured |
| CP2 | 90.4% | not measured | (>300%) | 3100 | 3300 | not measured | not measured |
| CP3 | not measured | not measured | not measured | not measured | not measured | $10^{13}$ | not measured |

The invention claimed is:

1. A film having a thickness of 500 μm and a transmission of greater than or equal to 80% at a wavelength ranging from 400 to 700 nm and/or the degree of haze less than or equal to 10%, comprising a polyamide-grafted polymer, said polyamide-grafted polymer comprising a polyolefin backbone that is an ethylene/alkyl (meth)acrylate copolymer containing a residue of at least one unsaturated monomer (X) and at least one polyamide graft in which:
   said polyamide graft is attached to the polyolefin backbone by the residue of the unsaturated monomer (X) that comprises a functional group capable of reacting via condensation reaction with a polyamide having at least one amine end group and/or at least one carboxylic acid end group;
   the residue of the unsaturated monomer (X) is attached to the backbone by grafting or copolymerization,
said polyamide-grafted polymer comprising:
   from 50 to 95% by weight of the polyolefin backbone comprising the unsaturated monomer (X); and
   from 5 to 50% by weight of the polyamide grafts,
and the flow temperature of said polyamide-grafted polymer being greater than or equal to 75° C, this flow temperature being defined as the highest temperature among the melting points ($T_m$) and the glass transition temperatures ($T_g$) of the polyamide graft and of the polyolefin backbone, said composition optionally containing less than 20% by weight of tackifying resin relative to the total weight of the composition,
   wherein the unsaturated monomer (X) is maleic anhydride.

2. The film of claim 1, characterized in that said polyamide-grafted polymer comprises from 15 to 30% by weight of polyamide grafts.

3. The film of claim 1, characterized in that said composition comprises, in addition, at least one coupling agent.

4. The film of claim 1, characterized in that the flow temperature of said polyamide-grafted polymer is the melting point or the glass transition temperature of said polyamide graft.

5. The film of claim 1, characterized in that said flow temperature of the polyamide-grafted polymer is in the range from 115 to 160° C.

6. The film of claim 1, characterized in that the flow temperature of said polyamide-grafted polymer is in the range from 75 to 115° C.

7. The film of claim 1, characterized in that the composition is nanostructured.

8. The film of claim 1, characterized in that the number-average molecular weight of said polyamide grafts is in the range from 1000 to 5000 g/mol.

9. The film of claim 1, characterized in that said polyamide grafts comprise at least one copolyamide.

10. The film of claim 1, characterized in that the polyolefin backbone has a melting point less than or equal to 100° C.

11. The film of claim 1, characterized in that the number of monomers (X) attached said polyolefin backbone is, on average greater than or equal to 1.3 and/or less than or equal to 10.

12. The film of claim 1, characterized in that some or all of the end groups of said polyamide graft are one or some amine functional groups.

13. The film of claim 1, characterized in that it comprises at least 75% by weight of polyamide-grafted polymer.

14. The film of claim 1, characterized in that it further comprises at least one additional component selected from the group consisting of crosslinking agents, UV absorbers, mineral fillers, plasticizers, dyestuffs, optical brighteners and fire retardants.

* * * * *